(12) United States Patent
Li

(10) Patent No.: US 11,121,342 B2
(45) Date of Patent: Sep. 14, 2021

(54) DISPLAY PANEL HAVING A NANO-STACK LAYER

(71) Applicant: SHENZHEN CHINA STAR OPTOELECTRONICS SEMICONDUCTOR DISPLAY TECHNOLOGY CO., LTD., Guangdong (CN)

(72) Inventor: Yuanyuan Li, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 22 days.

(21) Appl. No.: 16/630,885

(22) PCT Filed: Dec. 27, 2019

(86) PCT No.: PCT/CN2019/129272
§ 371 (c)(1),
(2) Date: Jan. 14, 2020

(65) Prior Publication Data
US 2021/0184160 A1 Jun. 17, 2021

(30) Foreign Application Priority Data
Dec. 16, 2019 (CN) .......................... 201911292660.0

(51) Int. Cl.
*H01L 51/52* (2006.01)
*H01L 51/50* (2006.01)
(Continued)

(52) U.S. Cl.
CPC ........ *H01L 51/5237* (2013.01); *H01L 27/322* (2013.01); *H01L 51/502* (2013.01);
(Continued)

(58) Field of Classification Search
CPC . H01L 51/5237; H01L 51/502; H01L 27/322; H01L 51/5253; H01L 51/5256; H01L 2251/301; G02F 1/133514
See application file for complete search history.

(56) References Cited

U.S. PATENT DOCUMENTS 10,504,971 B2 * 12/2019 Yang .................... H01L 27/3272
10,720,607 B2 * 7/2020 Song .................... H01L 51/5256
(Continued)

FOREIGN PATENT DOCUMENTS

CN 1568110 A 1/2005
CN 103730601 A 4/2014
(Continued)

*Primary Examiner* — Ida M Soward

(57) ABSTRACT

A display panel includes a light-emitting substrate, an encapsulation layer, and a color filter substrate. The encapsulation layer includes at least a first nano-stack layer for reflecting light emitted from the color filter substrate. The first nano-stack layer includes a first inorganic layer and a first organic layer disposed in a stack arrangement, and the first organic layer having a refractive index less than a refractive index of the first inorganic layer. By using at least one first nano-stack provided in the encapsulation layer to reflect red and/or green light emitted from the color filter substrate, the present invention can reduce light loss of the red light quantum dot conversion unit and the green light quantum dot conversion unit due to scattering, and improve light output efficiency.

10 Claims, 4 Drawing Sheets

(51) Int. Cl.
*H01L 27/32* (2006.01)
*G02F 1/133* (2006.01)
*G02F 1/1335* (2006.01)

(52) U.S. Cl.
CPC .... *G02F 1/133514* (2013.01); *H01L 51/5253* (2013.01); *H01L 51/5256* (2013.01); *H01L 2251/301* (2013.01)

(56) References Cited

U.S. PATENT DOCUMENTS

| | | | | |
|---|---|---|---|---|
| 10,811,637 | B2* | 10/2020 | Choi | H01L 27/3258 |
| 10,824,012 | B2* | 11/2020 | Jung | H01L 51/5275 |
| 10,852,580 | B2* | 12/2020 | Jung | G02F 1/133512 |
| 10,903,446 | B2* | 1/2021 | Son | H01L 51/524 |
| 10,916,722 | B2* | 2/2021 | Park | H01L 51/504 |
| 10,949,047 | B2* | 3/2021 | Na | G06F 3/0412 |
| 10,950,813 | B2* | 3/2021 | Lee | H01L 51/5096 |
| 2001/0026127 | A1 | 10/2001 | Yoneda | |
| 2015/0371573 | A1 | 12/2015 | Choi et al. | |
| 2017/0338284 | A1 | 11/2017 | Tang | |
| 2018/0047800 | A1 | 2/2018 | Choi et al. | |
| 2018/0123074 | A1 | 5/2018 | Lee et al. | |
| 2018/0156951 | A1 | 6/2018 | Baek et al. | |
| 2018/0182817 | A1 | 6/2018 | Jo et al. | |
| 2018/0241005 | A1 | 8/2018 | Kim et al. | |
| 2019/0064602 | A1 | 2/2019 | Kim et al. | |
| 2019/0180682 | A1 | 6/2019 | Kim | |
| 2020/0020886 | A1* | 1/2020 | Ishii | H05B 33/22 |
| 2020/0073169 | A1* | 3/2020 | Jung | G02F 1/134309 |
| 2020/0075891 | A1 | 3/2020 | Zhou et al. | |
| 2020/0161579 | A1* | 5/2020 | Kim | H01L 27/3211 |
| 2020/0227485 | A1* | 7/2020 | Park | H01L 51/5271 |
| 2020/0258945 | A1* | 8/2020 | Joo | H01L 51/502 |
| 2020/0258946 | A1* | 8/2020 | Kim | H01L 51/5275 |
| 2020/0266243 | A1* | 8/2020 | Kim | H01L 27/3244 |

FOREIGN PATENT DOCUMENTS

| | | |
|---|---|---|
| CN | 205645818 U | 10/2016 |
| CN | 107731868 A | 2/2018 |
| CN | 108022947 A | 5/2018 |
| CN | 108140745 A | 6/2018 |
| CN | 108153036 A | 6/2018 |
| CN | 108258009 A | 7/2018 |
| CN | 109148706 A | 1/2019 |
| CN | 109426042 A | 3/2019 |
| CN | 110034238 A | 7/2019 |
| JP | 3594018 B2 | 11/2004 |

* cited by examiner

DISPLAY PANEL HAVING A NANO-STACK LAYER

BACKGROUND OF INVENTION

1. Field of Invention

The present invention relates to a technical field of displays, and particularly to, a display panel.

2. Related Art

Quantum dot light-emitting diode (QD-OLED) technology is a display technology that combines electroluminescent diodes and quantum dot photoluminescence. QD-OLED technology uses electroluminescent diodes to generate blue light to excite red/green quantum dots to form a full-color display. It has excellent performance, such as wide color gamut and wide viewing angles, and is considered a potential technology for large-sized organic light-emitting diodes (OLEDs).

FIG. 1 shows a schematic structural view of a quantum dot light-emitting diode display panel. The quantum dot light-emitting diode display panel includes an array substrate 91, a blue electroluminescent diode 92, an encapsulation layer 93, an adhesive filled layer 94, a quantum dot photoconversion layer 95, and a color film layer 96 all sequentially stacked from bottom to top. The quantum dot photoconversion layer 95 includes red pixels 951 and green pixels 952 made of quantum dot materials. The blue light and ambient light (indicated by arrows in FIG. 1) generated by the blue electroluminescent diode 92 are used to excite the quantum dot conversion to emit red/green light.

Due to scattering of quantum dot material, and a phenomenon of refraction and reflection between an entire film of the quantum dot light-emitting diode display panel 90, the red/green light output efficiency is low, reducing brightness and a lifespan of the display panel. Furthermore, because of influence of ambient light, a contrast of the quantum dot light-emitting diode display panel 90 in a dark state is poor.

Therefore, it is imperative to provide an improved display panel to overcome the above-mentioned problem.

SUMMARY OF INVENTION

An object of the present invention is to provide a display panel to overcome problems of conventional quantum dot light-emitting diode display panels, such as low light output efficiency, low brightness, and poor contrast in a dark state.

In order to achieve the above-mentioned object, in one embodiment, the present invention provides a display panel, comprising a light-emitting substrate comprising a light-emitting layer; an encapsulation layer disposed on the light-emitting substrate; and a color filter substrate disposed opposite to the light-emitting substrate; wherein the encapsulation layer comprises at least a first nano-stack layer for reflecting light emitted from the color filter substrate, the first nano-stack layer comprises a first inorganic layer and a first organic layer disposed in a stack arrangement, and the first organic layer has a refractive index less than a refractive index of the first inorganic layer.

Further, when a number of the first nano-stack layer of the encapsulation layer is one, the refractive index of the first inorganic layer is n1, a thickness of the first inorganic layer is d1, the refractive index of the first organic layer is n2, a thickness of the first organic layer is d2, and a wavelength of light reflected by the encapsulation layer is $\lambda 1$, wherein $\lambda 1 = 2 \times (n1 \times d1 + n2 \times d2)$.

Further, light emitted from the color filter substrate is red light and/or green light.

Further, the color filter substrate comprises a base layer; a buffer layer disposed on the base layer and comprising at least a second nano-stack layer for reflecting light emitted from the light-emitting substrate; and a quantum dot photoconversion layer disposed on a surface of the buffer layer facing the light-emitting substrate; wherein the second nano-stack layer comprises a second inorganic layer and a second organic layer disposed in a stack arrangement, and the second organic layer has a refractive index less than a refractive index of the second inorganic layer.

Further, when a number of the second nano-stack layer of the buffer layer is one, the refractive index of the second inorganic layer is n3, a thickness of the second inorganic layer is d3, the refractive index of the second organic layer is n4, a thickness of the second organic layer is d4, and a wavelength of light reflected by the buffer layer is $\lambda 2$, wherein $\lambda 2 = 2 \times (n3 \times d3 + n4 \times d4)$.

Further, light emitted from the light-emitting substrate is blue light.

Further, the color filter substrate further comprises a color filter layer disposed on a surface of the quantum dot photoconversion layer away from the light-emitting substrate; wherein the color filter layer comprises a plurality of openings, and some of the openings are filled with a plurality of color resistance units, wherein the color resistance units are one of a red color resistance unit and a green color resistance unit, and the buffer layer is disposed on the color resistance units and covers the openings.

Further, the quantum dot photoconversion layer comprises a plurality of quantum dot photoconversion units, the light-emitting layer comprises a plurality of light-emitting units, and the quantum dot photoconversion units are provided corresponding to the light-emitting units; wherein the quantum dot photoconversion units each comprise a red light quantum dot conversion unit and a green light quantum dot conversion unit, the red light quantum dot conversion unit is disposed on the red color resistance unit, and the green light quantum dot conversion unit is disposed on the green color resist unit.

Further, the quantum dot photoconversion layer has a thickness between 20 nanometers (nm) and 100 nm.

Further, the light-emitting substrate comprises a substrate; a thin-film transistor layer disposed on the substrate; a plurality of first electrodes disposed on the thin-film transistor layer and spaced apart from each other; a pixel block layer disposed between adjacent two of the first electrodes on the thin-film transistor layer; the light-emitting layer disposed between adjacent two of the pixel block layers on the first electrodes; and a plurality of second electrodes disposed on the light-emitting layer and the pixel block layer.

The present invention relates to a display panel. On one hand, by using at least one first nano-stack provided in the encapsulation layer to reflect light, specifically red and/or green light, emitted from the color filter substrate, the present invention can reduce light loss of the red light quantum dot conversion unit and the green light quantum dot conversion unit due to scattering, thereby improving light output efficiency. On the other hand, by using at least one second nano-stack layer provided in the buffer layer to reflect light, specifically blue light, emitted from the light-emitting substrate, not only influence on devices from ambient light can be prevented, but also a reflected light path can be formed between the second nano-stack layer and the second electrodes, so that blue light can enter the quantum dot photoconversion layer multiple times and be used, and a utilization efficiency of blue light can be improved, thereby overcoming problems of conventional quantum dot light-emitting diode display panels, such as low light output efficiency, low brightness, and poor contrast in a dark state.

BRIEF DESCRIPTION OF DRAWINGS

To better illustrate embodiments or technical solutions in the prior art, a brief description of the drawings used in the embodiments or the prior art description will be given below. Obviously, the accompanying drawings in the following description merely show some embodiments of the present invention, and a person skilled in the art may still derive other drawings from these accompanying drawings without creative efforts.

DESCRIPTION OF PREFERRED EMBODIMENTS

Figure 1:
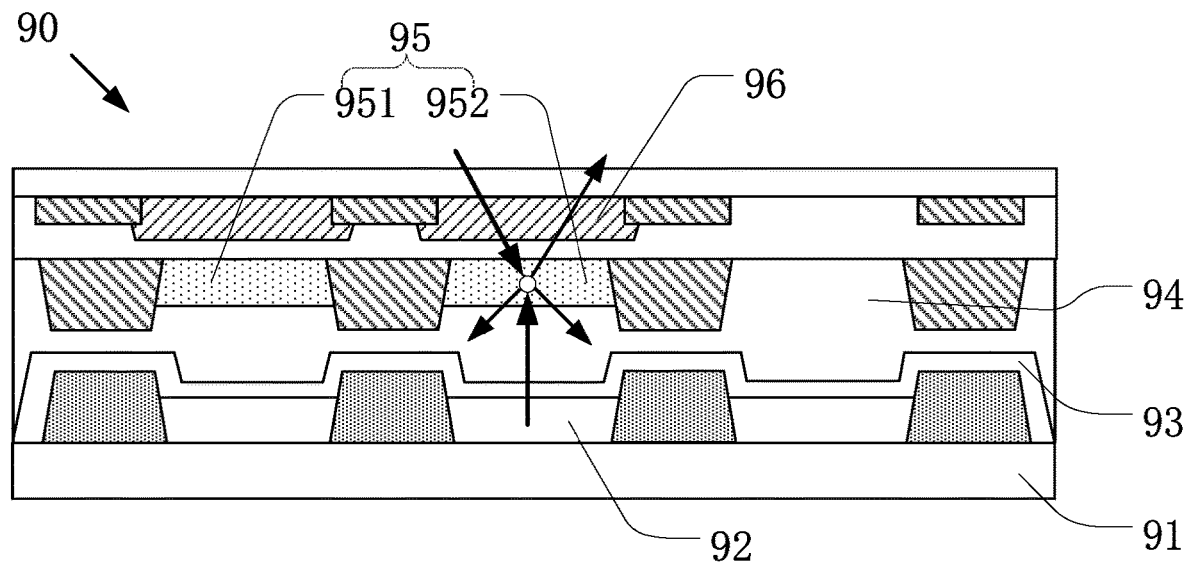
FIG. 1 is a schematic structural view of a conventional quantum dot light-emitting diode.

The following describes the preferred embodiments of the present invention in detail with reference to the accompanying drawings in order to completely introduce the technical content of the present invention to those skilled in the art, to exemplify that the present invention can be implemented, to make the technical content disclosed in the present invention clearer, so that those skilled in the art can more easily understand how to implement the invention. However, the present invention can be embodied by many different forms of embodiments. The protection scope of the present invention is not limited to the embodiments mentioned in the text, and the description of the following embodiments is not intended to limit the scope of the present invention.

Directional terms described by the present invention, such as upper, lower, front, back, left, right, inner, outer, side, etc., are only directions by referring to the accompanying drawings, and thus the used directional terms are used to describe and understand the present invention, but the present invention is not limited thereto.

In the drawings, components having the same structure are denoted by the same numerals, and components having similar structures or functions are denoted by similar numerals. In addition, in order to facilitate understanding and description, size and thickness of each component shown in the drawings are arbitrarily shown, and the present invention does not limit the size and thickness of each component.

When certain components are described as being "on" another component, the component may be placed directly on the other component. There may also be an intermediate component, and the component is placed on the intermediate component, while the intermediate component is placed on another component. When one component is described as "installed to" or "connected to" another component, both can be understood as directly "installed" or "connected", or a component is "installed to" or "connected to" another component through an intermediate component.

Embodiment 1

Figure 2:
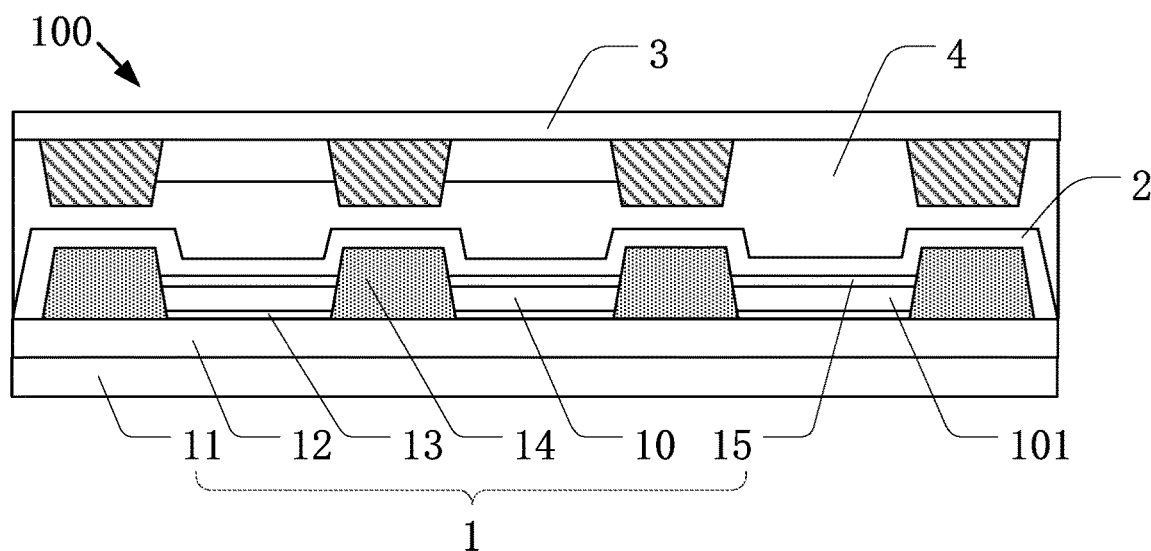
FIG. 2 is a schematic structural view of a display panel in accordance with a first embodiment of the present invention.
Figure 3:
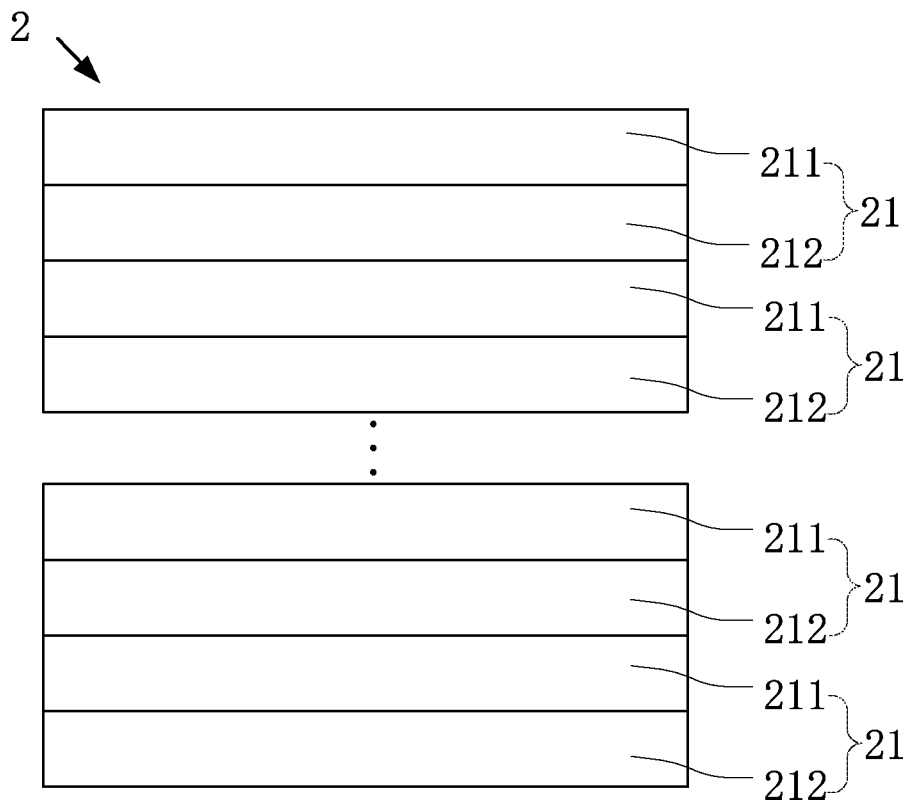
FIG. 3 is a schematic structural view of an encapsulation layer in accordance with the first embodiment of the present invention.

As shown in FIGS. 2 and 3, the present invention provides a display panel 100 including a light-emitting substrate 1, an encapsulation layer 2, and a color filter substrate 3. The light-emitting substrate 1 includes a light-emitting layer 10 for providing a light source. Preferably, light emitted by the light-emitting layer 10 includes blue light. The encapsulation layer 2 is disposed on the light-emitting substrate 1 and has a stack structure composed of inorganic layers and organic layers, thereby to prevent moisture and oxygen intrusion. The color filter substrate 3 is disposed opposite to the light-emitting substrate 1. The encapsulation layer 2 includes at least a first nano-stack layer 21 for reflecting light emitted from the color filter substrate 3. The first nano-stack layer 21 includes a first inorganic layer 211 and a first organic layer 212 disposed in a stack arrangement, wherein the first organic layer 212 has a refractive index less than a refractive index of the first inorganic layer 211. Specifically, the color filter substrate 3 includes a quantum light-emitting material, which can accept blue light to emit red light and/or green light.

As shown in FIG. 3, in this embodiment, when the encapsulation layer 2 has only one first nano-stack layer 21, the refractive index of the first inorganic layer 211 is n1, a thickness of the first inorganic layer 211 is d1, the refractive index of the first organic layer 212 is n2, a thickness of the first organic layer 212 is d2, and a wavelength of light reflected by the encapsulation layer 2 is $\lambda 1$, wherein $\lambda 1 = 2 \times (n1 \times d1 + n2 \times d2)$, and d1 and d2 are preferably ranged from 5 nanometers (nm) to 325 nm, and more preferably 50 nm, 100 nm, 150 nm, 200 nm, 250 nm, and 300 nm.

In this embodiment, light emitted from the color filter substrate 3 is red light and/or green light. By using at least one first nano-stack 21 provided in the encapsulation layer 2 to reflect red and/or green light emitted from the color filter substrate 3, light loss due to scattering can be reduced, thereby improving light output efficiency, and overcoming problems of conventional quantum dot light-emitting diode display panels, such as low light output efficiency, low brightness, and poor contrast in the dark state.

As shown in FIG. 3, it can be understood that when the encapsulation layer 2 has a plurality of the first nano-stack layers 21 disposed in a stack arrangement, each of the first nano-stacks 21 correspondingly reflects light of a certain wavelength in red light and/or green light. The plurality of the first nano-stack layer 21 structured in a stack manner cooperatively achieve an effect of reflecting red light and/or green light. Electromagnetic waves with a wavelength of 380 nm-780 nm are visible light, of which red light ranged between 640 nm-780 nm, orange light ranged between 640 nm-610 nm, yellow light ranged between 610 nm-530 nm, green light ranged between 505 nm-525 nm, blue light ranged between 505 nm-470 nm, and purple light ranged between 470 nm-380 nm. If the encapsulation layer 2 is configured to reflect red light, the wavelength range of the red light is divided into several segments, and an intermediate value of each segment is taken as the λ1 value in the formula λ1=2×(n1×d1+n2×d2). Thereby, values of the thicknesses d1 and d2 can be calculated.

For materials and corresponding refractive index values of the first inorganic layer 211 and the first organic layer 212 in this embodiment, please refer to Table 1.

TABLE 1

| | Material | Refractive Index | Material | Refractive Index |
|---|---|---|---|---|
| Inorganic Material | SiNx | 2.1-2.7 | TiO2 | 2.49-2.56 |
| | SiOx | 1.54 | Al2O3 | 1.76 |
| | NiO | 2.18 | AlN | 1.87-2.2 |
| | ZrO2 | 1.93 | ITO | 1.8-2.1 |
| Organic Material | Organic Silicone | 1.41-1.53 | Epoxy resin | 1.5-1.6 |
| | PMMA | 1.48 | PC | 1.58 |
| | COP | 1.63 | TPX | 1.45 |
| | ABS | 1.56 | PSU | 1.62 |

As shown in FIG. 2, in this embodiment, the light-emitting substrate 1 includes a substrate 11, a thin-film transistor layer 12, a plurality of first electrode 13, a pixel block layer 14, the light-emitting layer 10, and a plurality of second electrode layer 15. The thin-film transistor layer 12 is disposed on the substrate 11. The first electrodes 13 are disposed on the thin-film transistor layer 12 and spaced apart from each other. The pixel block layer 14 is disposed between adjacent two of the first electrodes 13 on the thin-film transistor layer 12. The light-emitting layer 10 is disposed between adjacent two of the pixel block layers 14 on the first electrodes 13. The second electrodes 15 are disposed on the light-emitting layer 10 and the pixel block layer 14. Preferably, the first electrodes 13 are anodes, and the second electrodes 15 are cathodes.

As shown in FIG. 2, in this embodiment, the display panel 100 further includes an adhesive filled layer 4 disposed between the color filter substrate 3 and the light-emitting substrate 1 for bonding the color filter substrate 3 and the light-emitting substrate 1 and for filling up a gap therebetween.

Embodiment 2

Figure 4:
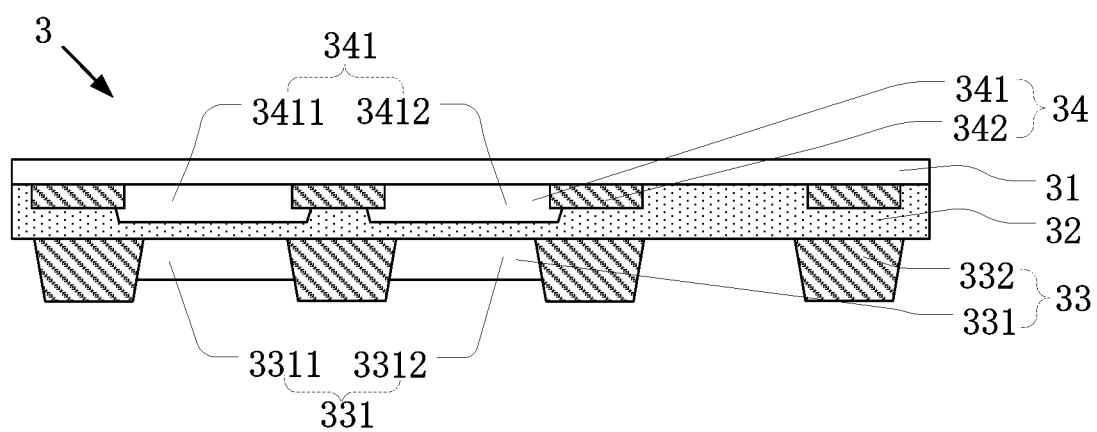
FIG. 4 is a schematic structural view of a color filter substrate in accordance with a second embodiment of the present invention.
Figure 5:
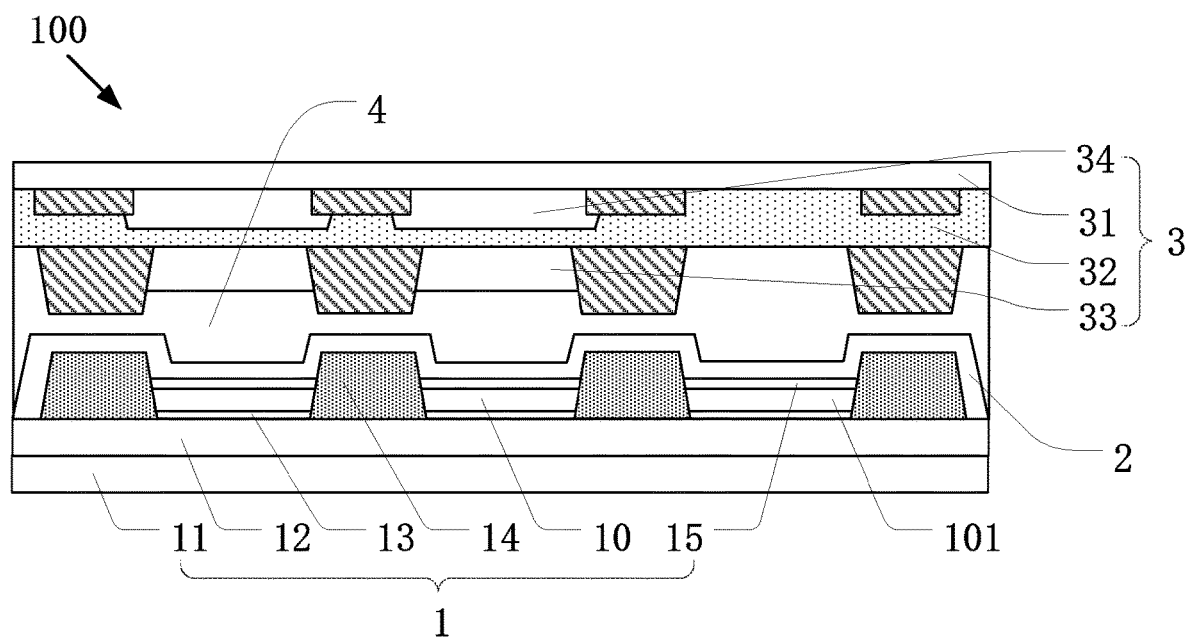
FIG. 5 is a schematic structural view of a display panel in accordance with the second embodiment of the present invention.
Figure 6:
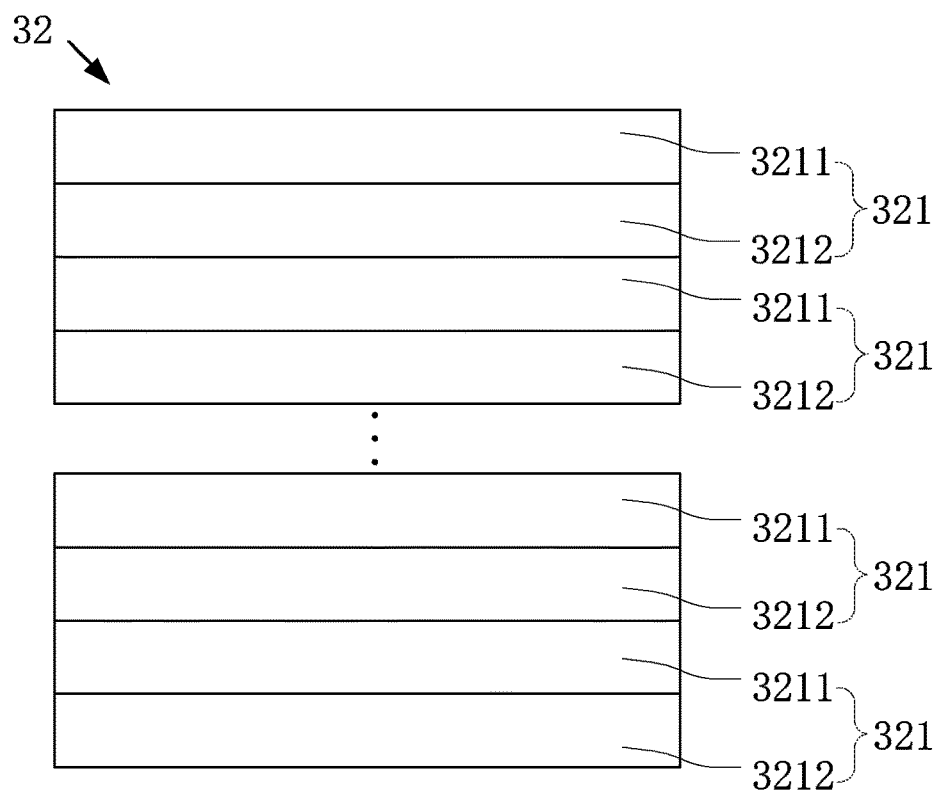
FIG. 6 is a schematic structural view of a buffer layer in accordance with the second embodiment of the present invention.

As shown in FIGS. 4, 5, and 6, the second embodiment includes all the technical features of the first embodiment. A difference from the first embodiment lies in that the color filter substrate 3 in the second embodiment includes a base layer 31, a buffer layer 32, and a quantum dot photoconversion layer 33. The buffer layer 32 is disposed on the base layer 31 and includes at least a second nano-stack layer 321 for reflecting light emitted from the light-emitting substrate 1. The quantum dot photoconversion layer 33 is disposed on a surface of the buffer layer 32 facing the light-emitting substrate 1. The second nano-stack layer 321 includes a second inorganic layer 3211 and a second organic layer 3212 disposed in a stack arrangement, and the second organic layer 3212 has a refractive index less than a refractive index of the second inorganic layer 3211.

As shown in FIG. 6, in this embodiment, when the buffer layer 32 has only one second nano-stack layer 321, the refractive index of the second inorganic layer 3211 is n3, a thickness of the second inorganic layer 3211 is d3, the refractive index of the second organic layer 3212 is n4, a thickness of the second organic layer 3212 is d4, and a wavelength of light reflected by the buffer layer 32 is λ2, wherein λ2=2×(n3×d3+n4×d4), and d3 and d4 are preferably ranged from 5 nm to 325 nm, and more preferably 50 nm, 100 nm, 150 nm, 200 nm, 250 nm, and 300 nm.

In this embodiment, light emitted from the light-emitting substrate 1 is blue light. By using at least one second nano-stack layer 321 provided in the buffer layer 32 to reflect blue light emitted from the light-emitting substrate 1, not only influence on devices from ambient light can be prevented, but also a reflected light path can be formed between the second nano-stack layer and the second electrodes 15, so that blue light can enter the quantum dot photoconversion layer 33 multiple times and be used, and a utilization efficiency of blue light can be improved, thereby overcoming problems of conventional quantum dot light-emitting diode display panels, such as low light output efficiency, low brightness, and poor contrast in the dark state.

As shown in FIG. 6, it can be understood that when the buffer layer 32 has a plurality of the second nano-stack layers 321 disposed in the stack arrangement, a principle of reflecting blue light in this embodiment is the same as the principle of reflecting red and/or green light in the first embodiment, and materials and corresponding refractive index values of the second inorganic layer 3211 and the second organic layer 3212 can also be referred to Table 1, which will not be reiterated here.

As shown in FIGS. 4 and 5, in this embodiment, the color filter substrate 3 further includes a color filter layer 34 disposed on a surface of the quantum dot photoconversion layer 33 away from the light-emitting substrate 1. The color filter layer 34 includes a plurality of openings, and some of the openings are filled with a plurality of color resistance units 341. The color resistance units 341 are one of a red color resistance unit 3411 and a green color resistance unit 3412. The buffer layer 32 is disposed on the color resistance units 341 and covers the openings. It can be understood that a main part of the color filter layer 34 is a black matrix 342 disposed corresponding to the pixel block layer 14 of the light-emitting substrate 1. The openings are provided at positions of the black matrix 342 corresponding to the light-emitting layer 10, and the color resist units 341 are filled in some of the openings.

In this embodiment, the quantum dot photoconversion layer 33 includes a plurality of quantum dot photoconversion units 331, the light-emitting layer 10 includes a plurality of light-emitting units 101, and the quantum dot photo-conversion units 331 are provided corresponding to the light-emitting units 101. The quantum dot photoconversion units 331 each includes a red light quantum dot conversion unit 3311 and a green light quantum dot conversion unit 3312. The red light quantum dot conversion unit 3311 is correspondingly disposed on the red color resistance unit 3411, and the green light quantum dot conversion unit 3312 is disposed on the green color resist unit 3412. Such a structure facilitates the light emitted by the red light quantum dot conversion unit 3311 and the green light quantum dot conversion unit 3312 to pass through the color resistance unit 341 in the color film layer 34. Furthermore, it can be understood that a black blocking wall 332 is provided at a position of the quantum dot photoconversion layer 33 corresponding to the black matrix 342 of the color filter layer 34 for light shielding.

Embodiment 3

Figure 7:
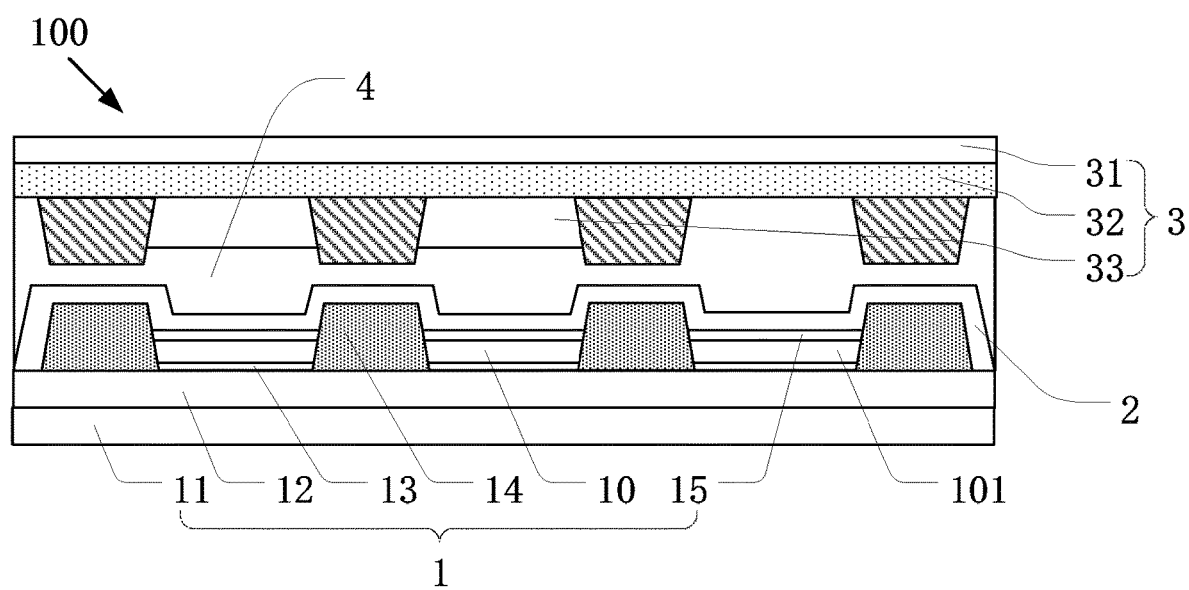
FIG. 7 is a schematic structural view of a display panel in accordance with a third embodiment of the present invention.

As shown in FIG. 7, the third embodiment includes all the technical features of the second embodiment. A difference from the second embodiment lies in that there is no color filter layer 34 provided in the third embodiment, and remains only the quantum dot photoconversion layer 33 having a thickness between 20 nm and 100 nm, so that the color filter layer 34 can be left out, thereby increase brightness of the panel, and at the same time preventing ambient light from causing degradation of the quantum dot photoconversion unit 331 and the light-emitting layer 10.

The principle of increasing the brightness is that the color filter layer 34 functions to filter out excess light of other colors to obtain pure monochromatic light. At present, a thickness of the quantum dot photoconversion layer 33 can be reached at about 10 nm, and the color film layer 34 needs to be fabricated. When the quantum dot photoconversion layer 33 is relatively thick, for example, 20 nm or more, excess blue light can be completely absorbed by the quantum dot photoconversion layer 33, so that there is no need to provide the color film layer 34. The thickness of the quantum dot photoconversion layer 33 in this embodiment is preferably 21 nm, 22 nm, 23 nm, 24 nm, 25 nm, 26 nm, 27 nm, 28 nm, 29 nm, 30 nm, 40 nm, 50 nm, 60 nm, 70 nm, 80 nm, 90 nm.

By using at least one first nano-stack 21 provided in the encapsulation layer 2 to reflect light, specifically red and/or green light, emitted from the color filter substrate 3, the present invention can reduce light loss of the red light quantum dot conversion unit 3311 and the green light quantum dot conversion unit 3312 due to scattering, thereby improving light output efficiency. On the other hand, by using at least one second nano-stack layer 321 provided in the buffer layer 32 to reflect light, specifically blue light, emitted from the light-emitting substrate 1, not only influence on devices from ambient light can be prevented, but also a reflected light path can be formed between the second nano-stack layer and the second electrodes 15, so that blue light can enter the quantum dot photoconversion layer 33 multiple times and be used, and a utilization efficiency of blue light can be improved, thereby overcoming problems of conventional quantum dot light-emitting diode display panels, such as low light output efficiency, low brightness, and poor contrast in a dark state.

The display panel 100 of the present invention is described in detail above. It is understood that the exemplary embodiments described herein are to be considered as illustrative only, and are not intended to limit the invention. Descriptions of features or aspects in each exemplary embodiment should generally be considered as suitable features or aspects in other exemplary embodiments. While the invention has been described with reference to the preferred embodiments thereof, various modifications and changes can be made by those skilled in the art. The present invention is intended to cover these changes and modifications within the scope of the appended claims. Any modification, equivalent replacement, and improvement made according to the principle of the present invention shall be included in the claims of the present invention.

What is claimed is:

1. A display panel, comprising:
a light-emitting substrate comprising a light-emitting layer;
an encapsulation layer disposed on the light-emitting substrate; and
a color filter substrate disposed opposite to the light-emitting substrate;
wherein the encapsulation layer comprises at least a first nano-stack layer for reflecting light emitted from the color filter substrate, the first nano-stack layer comprises a first inorganic layer and a first organic layer disposed in a stack arrangement, and the first organic layer has a refractive index less than a refractive index of the first inorganic layer.

2. The display panel of claim 1, wherein when a number of the first nano-stack layer of the encapsulation layer is one, the refractive index of the first inorganic layer is n1, a thickness of the first inorganic layer is d1, the refractive index of the first organic layer is n2, a thickness of the first organic layer is d2, and a wavelength of light reflected by the encapsulation layer is λ1, wherein λ1=2×(n1×d1+n2×d2).

3. The display panel of claim 1, wherein light emitted from the color filter substrate is red light and/or green light.

4. The display panel of claim 1, wherein the color filter substrate comprises:
a base layer;
a buffer layer disposed on the base layer and comprising at least a second nano-stack layer for reflecting light emitted from the light-emitting substrate; and
a quantum dot photoconversion layer disposed on a surface of the buffer layer facing the light-emitting substrate;
wherein the second nano-stack layer comprises a second inorganic layer and a second organic layer disposed in a stack arrangement, and the second organic layer has a refractive index less than a refractive index of the second inorganic layer.

5. The display panel of claim 4, wherein when a number of the second nano-stack layer of the buffer layer is one, the refractive index of the second inorganic layer is n3, a thickness of the second inorganic layer is d3, the refractive index of the second organic layer is n4, a thickness of the second organic layer is d4, and a wavelength of light reflected by the buffer layer is λ2, wherein λ2=2×(n3×d3+n4×d4).

6. The display panel of claim 5, wherein light emitted from the light-emitting substrate is blue light.

7. The display panel of claim 4, wherein the color filter substrate further comprises:
a color filter layer disposed on a surface of the quantum dot photoconversion layer away from the light-emitting substrate;
wherein the color filter layer comprises a plurality of openings, and some of the openings are filled with a plurality of color resistance units, wherein the color resistance units are one of a red color resistance unit and a green color resistance unit, and the buffer layer is disposed on the color resistance units and covers the openings.

8. The display panel of claim 7, wherein the quantum dot photoconversion layer comprises a plurality of quantum dot photoconversion units, the light-emitting layer comprises a plurality of light-emitting units, and the quantum dot photoconversion units are provided corresponding to the light-emitting units;
wherein the quantum dot photoconversion units each comprise a red light quantum dot conversion unit and a green light quantum dot conversion unit, the red light quantum dot conversion unit is disposed on the red color resistance unit, and the green light quantum dot conversion unit is disposed on the green color resist unit.

9. The display panel of claim 4, wherein the quantum dot photoconversion layer has a thickness between 20 nanometers (nm) and 100 nm.

10. The display panel of claim 1, wherein the light-emitting substrate comprises:

a substrate;
a thin-film transistor layer disposed on the substrate;
a plurality of first electrodes disposed on the thin-film transistor layer and spaced apart from each other;
a pixel block layer disposed between adjacent two of the first electrodes on the thin-film transistor layer;
the light-emitting layer disposed between adjacent two of the pixel block layers on the first electrodes; and
a plurality of second electrodes disposed on the light-emitting layer and the pixel block layer.

* * * * *